United States Patent [19]
Nishihara et al.

[11] Patent Number: 5,118,458
[45] Date of Patent: Jun. 2, 1992

[54] METHOD FOR MOLDING AN ARTICLE INTEGRATED WITH A MULTI-LAYER FLEXIBLE CIRCUIT AND AN APPARATUS FOR CARRYING OUT THE METHOD

[75] Inventors: Munekazu Nishihara, Neyagawa; Tetsuo Fukushima, Katano; Kenichiro Suetsugu, Amagasaki; Junji Ikeda, Ikoma, all of Japan

[73] Assignee: Matsushita Electric Industrial Co., Ltd., Osaka, Japan

[21] Appl. No.: 731,274

[22] Filed: Jul. 17, 1991

[51] Int. Cl.$^5$ .............................. B29C 45/16
[52] U.S. Cl. ...................... 264/155; 264/134; 264/250; 264/255; 425/121; 425/311; 425/316
[58] Field of Search ............... 264/154, 155, 156, 129, 264/132, 134, 135, 136, 250, 255, 272.17; 425/117, 121, 123, 127, 289, 311, 316

[56] References Cited
U.S. PATENT DOCUMENTS
4,943,334 7/1990 Medney et al. .................. 264/258

Primary Examiner—Jay H. Woo
Assistant Examiner—Jeremiah F. Durkin, II
Attorney, Agent, or Firm—Wenderoth, Lind & Ponack

[57] ABSTRACT

A method for molding an article integrated with a multi-layer flexible circuit by embedding the circuit in a molding material to be shaped into a certain configuration. A first flexible circuit layer is sandwiched between a fixed mold and a movable mold so as to perform an injection shaping of one side of the molding material. A plurality of flexible circuits from the second layer of flexible circuit and subsequent flexible circuits are sequentially sandwiched between the fixed mold and the movable mold and they are layered one on the other. The movable mold contains a heater. The pattern of each flexible circuit is traced with thermosetting conductive paste which is hardened by the heater of the movable mold when flexible circuits are laminated on each other. Each flexible circuit has a hot-melt type adhesive layer on the rear surface thereof. The adhesive layer is melted by the heater of the movable mold so as to place each flexible circuit layer in position when flexible circuits are laminated on each other. Through-holes are formed by punching and conductive paste is charged into the through-holes with the last layer of flexible circuit sandwiched between the fixed mold and the movable mold. Then, the injection shaping of the other side of the material is carried out.

7 Claims, 9 Drawing Sheets

METHOD FOR MOLDING AN ARTICLE INTEGRATED WITH A MULTI-LAYER FLEXIBLE CIRCUIT AND AN APPARATUS FOR CARRYING OUT THE METHOD

BACKGROUND OF THE INVENTION

1. Field of the Invention

The present invention relates to a method for molding an article integrated with a multi-layer flexible circuit and an apparatus for carrying out the method and more particularly, to a method for embedding a multi-layer flexible circuit in a product by injection molding and an apparatus therefor.

2. Description of the Related Arts

Conventionally, a molded circuit board (MCB) is known. That is, a printed circuit board (PCB) is embedded in a product. Generally, the MCB is obtained by a process of injection molding. If a product including the MCB is complicated three-dimensionally, a flexible printed circuit board may be used as a PCB.

A circuit pattern is formed on a single layer by printing method to form a flexible printed circuit. But hitherto, a multi-layer flexible printed circuit has not been formed. The multi-layer flexible printed circuit means a flexible printed circuit in which the wiring pattern of each layer is electrically conductive. The reason the method for forming the multi-layer flexible printed circuit has not been developed so far is because a material consisting of a film is flexible. That is, it is very difficult to prevent the dislocation of each layer from each other layers when films are laminated on each other. More specifically, it is difficult to electrically connect the patterns of layers with each other pattern with each layer placed in position.

A known method forms a multi-layer printed circuit as follows: That is, a pattern is formed on a hard substrate consisting of, for example, ceramic or glass epoxy resin; a plurality of printed circuit boards is laminated on each other; through-holes penetrating through the pattern of each layer are formed; and conductive paste is charged into the through-holes. Since the multi-layer printed circuit thus formed includes a hard substrate, it is possible to laminate layers on each other at predetermined positions. Therefore, the pattern of each layer can be electrically connected with each other accurately. Although a plurality of layers can be laminated on each other, a hard substrate is used, which means that the configuration of the multilayer printed circuit is flat. Thus, this method is inapplicable to the formation of a molded circuit board complicated three-dimensionally.

The flexible printed circuit used in the conventional MCB is suitable for a mass-production because the circuit pattern is formed by printing. However, means for effectively forming the MCB according to varied circuit patterns have not developed yet. Needless to say, means for forming a multi-layered MCB capable of coping with varied circuit patterns have not been developed either.

SUMMARY OF THE INVENTION

It is an object of the present invention to provide a method for forming a product integrated with a multi-layer flexible circuit embedded therein and an apparatus for carrying out the method.

In accomplishing these and other objects, a method for molding an article integrated with a multi-layer flexible circuit according to an embodiment of the present invention comprises following steps of:

(a) forming a flexible circuit by tracing a circuit pattern with a thermosetting conductive paste on a surface of a film base having an adhesive layer of hot-melt type on a rear surface thereof;

(b) setting the flexible circuit between a fixed mold having a closed small hole which can be opened to form a through-hole and a movable mold cooperating with the fixed mold and having a punching die cooperating with the small hole of the fixed mold so that the punching die can be inserted into the movable mold and is movable relative thereto;

(c) sandwiching the flexible circuit between the movable mold heated and the fixed mold so as to make a layer of the flexible circuit on the fixed mold;

(d) charging a predetermined amount of molding material between the fixed mold and the layer of flexible circuit;

(e) reducing the temperature of the layer of flexible circuit sandwiched at step (c) and the molding material charged at step (d);

(f) repeating the steps (a), (b) and (c) at least once so that a plurality of the layers of flexible circuit is laminated on the molding material charged at step (d);

(g) forming a through-hole through the layers of flexible circuit laminated and the molding material by opening the small hole of the fixed mold and projecting the punching die of the movable mold therefrom;

(h) charging thermosetting conductive paste into the through-hole;

(i) heating the thermosetting conductive paste charged into the through-hole, so that a multi-layer flexible circuit is formed;

(j) charging a predetermined amount of molding material between the multi-layer flexible circuit and the movable mold; and (k) reducing the temperature of the molding material charged at step (j).

According to the above-described method of the embodiment, the flexible circuit is formed at step (a). The thermosetting conductive paste is not hardened at this time. At step (b), the flexible circuit is set between the fixed mold having the mechanism for forming the through-hole and the movable mold. At step (c), the conductive paste of the flexible circuit is hardened and the hot-melt type adhesive layer is softened by the heat of the movable mold. At step (d), one side of the product is formed and the molded material of the one side of the product and the first layer of flexible circuit are brought into close contact. At step (e), the molded material and the adhesive layer are hardened. Consequently, the one side of the material is adhered to the first layer of flexible circuit. At steps (f), flexible circuits from the second layer to the last layer are sequentially laminated on the fixed mold. When a layer of the flexible circuit, for example, an (n+1)th layer of the flexible circuit is laminated on an n-th layer of the flexible circuit, the conductive paste of the circuit pattern of the (n+1)th layer of the flexible circuit is hardened and the adhesive layer thereof is softened by the heat of the movable mold. The temperature of the adhesive layer of the (n+1)th layer of the flexible circuit falls in contact with the n-th layer of the flexible circuit, with the result that the adhesive layer of the (n+1)th layer of the flexible circuit is hardened in such a degree that both flexible circuits are adhered to each other. At step (g), throughhole is formed by punching. At step (h), conductive paste is charged into the through-hole and the electrically conductive portions are formed in each layer of the flexible circuit. At step (i), the conductive paste in the throughhole is hardened, so that all layers of the flexible circuit make a multi-layer flexible circuit. At step (j) and (k), the other side of the product is formed into a predetermined configuration.

As a result of the operation performed at each step, a plurality of layers of the flexible circuits can be laminated in the product and the circuit pattern of each flexible circuit become reliably electrically conductive without flexible circuits dislocating from each other. That is, a multi-layer flexible circuit can be embedded in an MCB.

In particular, since the circuit pattern is formed not by printing but by tracing, various circuit patterns can be formed.

Further, most of molding processes are performed by only the molds and devices in the vicinity thereof.

A method for molding an article integrated with a multi-layer of flexible circuit according to another embodiment of the present invention comprises following steps of:

(a) forming a flexible circuit by tracing a circuit pattern with a thermosetting conductive paste on a surface of a film base having an adhesive layer of hot-melt type on a rear surface thereof;

(b) setting the flexible circuit between a fixed mold having a closed small hole which can be opened to form a through-hole and a movable mold cooperating with the fixed mold and having a punching die cooperating with the small hole of the fixed mold so that the punching die can be inserted into the movable mold and is movable relative thereto;

(c) sandwiching the flexible circuit between the movable mold heated and the fixed mold so as to make a layer of the flexible circuit on the fixed mold;

(d) charging a predetermined amount of molding material between the fixed mold and the layer of flexible circuit;

(e) reducing the temperature of the layer of flexible circuit sandwiched at step (c) and the molding material charged at step (d);

(l) repeating the steps (a), (b) and (c) at least once so that a plurality of the layers of flexible circuit is laminated on the molding material charged, wherein a temperature of the movable mold heated at the last step (c) is lower than that at the other step (c);

(g) forming a through-hole through the layers of flexible circuit laminated and the molding material by opening the small hole of the fixed mold and projecting the punching die of the movable mold therefrom;

(h) charging thermosetting conductive paste into the through-hole;

(m) mounting a predetermined electric parts on the circuit pattern of the layer of flexible circuit sandwiched at the last step (c);

(n) heating the conductive paste charged into the through-hole and conductive paste for forming the pattern of the layer of flexible circuit on which the predetermined electric parts has been mounted at step (m);

(j) charging a predetermined amount of molding material between the layer of flexible circuit sandwiched at the last step (c) and the movable mold; and (k) reducing the temperature of the molding material charged at step (j).

The molding method according to this embodiment is essentially the same as the above-described method. According to this method, flexible circuits can be embedded in the product with a desired electric parts mounted on the multilayer flexible circuit. Therefore, at step (1), when the last layer of flexible circuit is sandwiched between the upper and lower molds, the temperature of the movable mold is kept to be low to prevent the conductive paste of the circuit pattern from being hardened completely. Thus, the electric parts can be mounted on the multi-layer flexible circuit at step (m). Since it is necessary to completely harden the conductive paste including that in the through-hole, the conductive paste is completely hardened at step (n).

BRIEF DESCRIPTION OF THE DRAWINGS

These and other objects and features of the present invention will become apparent from the following description taken in conjunction with the preferred embodiments thereof with reference to the accompanying drawings, in which.

DETAILED DESCRIPTION OF THE INVENTION

Figure 1:
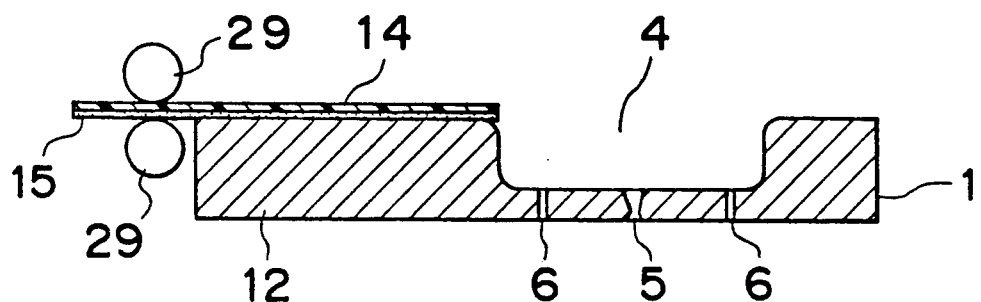
FIGS. 1 through 21 are views for sequentially describing an injection shaping method for shaping flexible circuits into a multi-layer flexible circuit according to an embodiment of the present invention.

Before the description of the present invention proceeds, it is to be noted that like parts are designated by like reference numerals throughout the accompanying drawings.

A mold to be used in an embodiment according to the present invention comprises a fixed lower mold 1 and a movable upper mold 2 provided above the lower mold 1. The lower mold 1 includes a movable lower member 3 below it. The movable lower member 3 will be described in detail later. A cavity 4 is formed in the lower mold 1. A resin injecting gate 5 is formed in the bottom of the cavity 4 at approximately the center thereof. A plurality of small holes for forming through-holes is also formed in the bottom of the cavity 4 at desired positions thereof. The lower mold 1 is integrated with a table 12 extending laterally from the edge of the cavity 4, thus sharing the upper surface thereof with the table 12.

Figure 4:
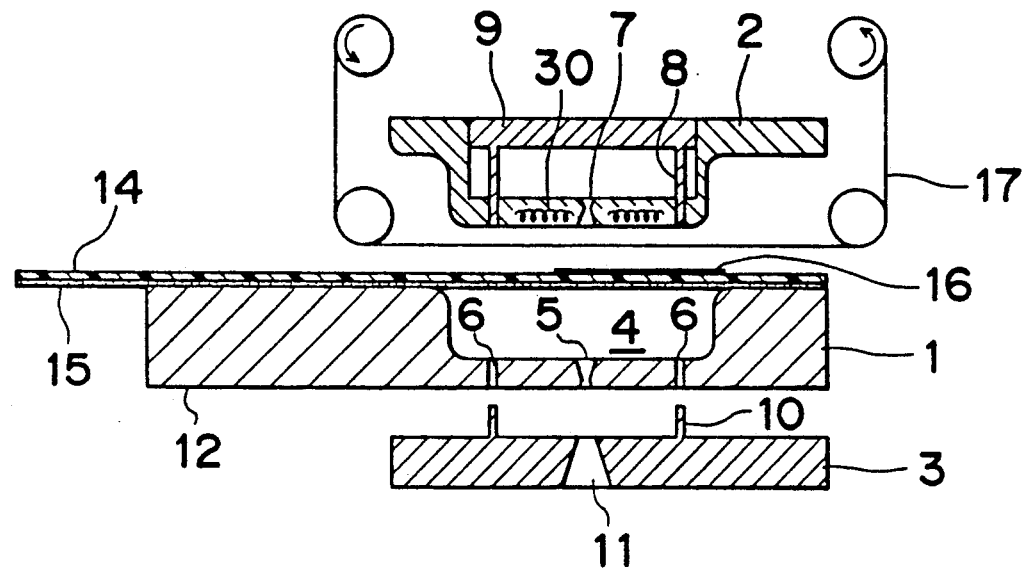

The upper mold 2 moves vertically, thus moving into the cavity 4 of the lower mold 1 positioned below the upper mold 2 and moving out therefrom. A gate 7 is formed in the bottom of the upper mold 2 at the center thereof similarly to the lower mold 1. The upper mold 2 is slidably provided with a punching die 9 having pins 8 for forming through-holes. The position of each pin 8 corresponds to each small hole 6 of the lower mold 1. Although not shown, a driving device operated by, for example, hydraulic mechanism moves the punching die 9 vertically relative to the upper mold 2. The pin 8 penetrates through the bottom wall of the upper mold 2, thus projecting from the bottom surface of the upper mold 2 with the downward movement of the punching die 9. As shown in FIG. 4, the upper mold 2 includes a heater 30 similarly to known molds for injection molding The movable lower member 3 has pins 10 for opening and closing the small holes 6 of the lower mold 1 positioned above the movable lower member 3. An opening 11 for inserting a resin injecting nozzle (not shown) thereinto is formed in the movable lower member 3 in correspondence with the position of the gate 5 of the upper mold 2.

The injection molding method according to the embodiment and an apparatus for carrying out the method are described below.

Figure 2:
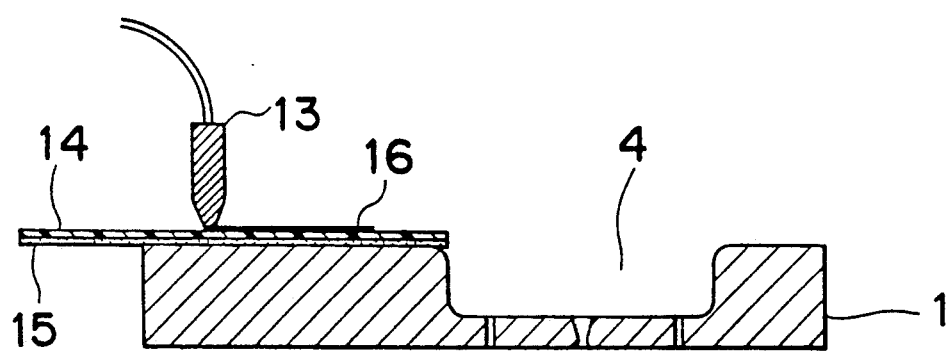
Figure 3:
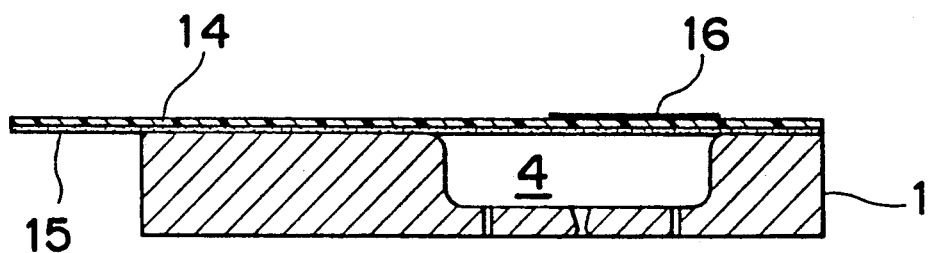

First, referring to FIG. 1, a film 14 to be used as the base of a flexible circuit is supplied to the upper surface of the table 12 by a film feeding supply mechanism 29. As the film feeding mechanism, various known mechanisms such as a pair of rollers or a device comprising sprockets and perforations can be utilized. The film 14 which is to be formed into a product is required to withstand a contraction and a transformation due to heating. Therefore, a polyimide resin can be utilized as the material of the film 14. A hot-melt type adhesive layer 15 is formed on the rear surface of the film 14. As shown in FIG. 2, a nozzle 13 discharges thermosetting conductive paste, thus tracing a circuit pattern on the surface of the film 14 set on the table 12. Thus, flexible circuits are formed one by one. The nozzle 13 is electrically connected with a mechanism such as a computer aided design (CAD) system for supplying the information of each circuit pattern, thus tracing a circuit pattern 16 on the film 14 based on the pattern information thereof supplied by the mechanism. As shown in FIG. 3, the film 14 on which the circuit pattern 16 has been formed is fed between the lower mold 1 and the upper mold 2, and then, pressed into the cavity 4 of the lower mold 1 by the upper mold 2 at a predetermined position in the cavity 4. Accordingly, the circuit pattern 16 is traced so that each circuit layer is electrically conductive through the positions of through-holes, namely, the positions of small holes 6 of the lower mold 1 as well as the positions of pins 8 of the upper mold 2.

Figure 5:
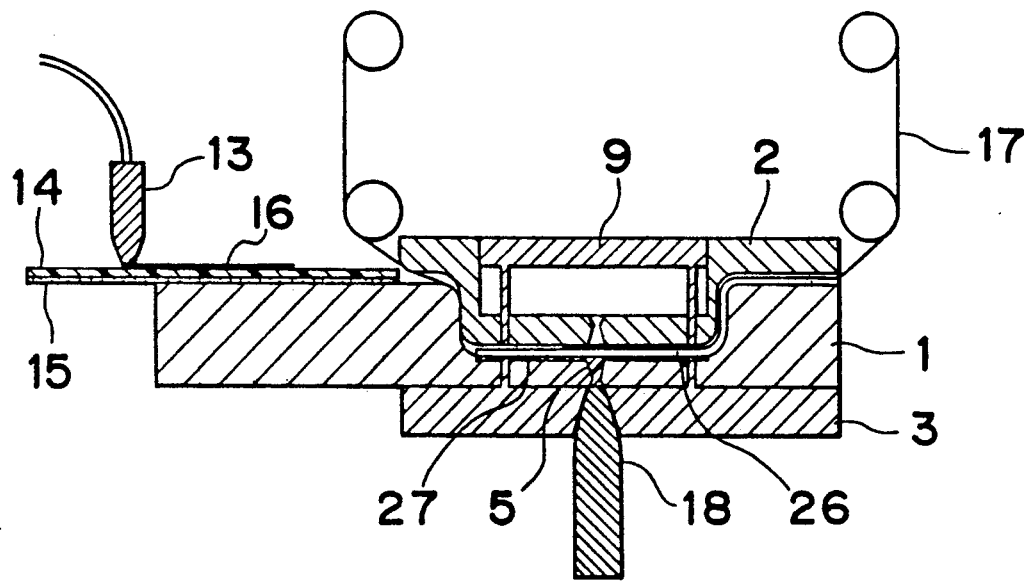

When a flexible circuit 26 is pressed into the cavity 4, the flexible circuit 26 contacts the bottom surface of the upper mold 2 being heated by the heater 30 of the upper mold 2. As a result, the conductive paste of the circuit pattern is hardened and the adhesive layer 15 formed on the rear surface of the film 14 is softened. A separating film 17 is sandwiched between the upper mold 2 and the flexible circuit 26. The molding lubricant film 17 prevents the conductive paste of the flexible circuit 26 from adhering to the upper mold 2, thus facilitating the separation of the upper mold 2 from the flexible circuit 26 when the upper mold 2 is moved upward. When the upper mold 2 presses the flexible circuit 26 into the cavity 4 of the lower mold 1, a resin injecting nozzle 18 injects a resin 27 between the lower mold 1 and the flexible circuit 26 through the gate 5 as shown in FIG. 5. At this time, one end of the film 14 is cut off by the lower mold 1 and the upper mold 2, and the lower member 3 is connected with the lower mold 1 so that the pins 10 of the lower member 3 closes the small holes 6 of the lower mold 1. The conductive paste 16 of the circuit pattern formed on the film 14 is completely hardened while the adhesive layer 15 is softened by the heat of the upper mold 2 as well as the injected resin 27. When the resin injection is completed, the heater 30 stops heating the upper mold 2. As a result, the temperature of the resin 27 and the adhesive layer 15 drops, and the first layer of flexible circuit $26_a$ is adhered to the resin 27. In order to accelerate the hardening of the resin 27 and the adhesive layer 15, the lower mold 1 and the upper mold 2 may be cooled by a fan as necessary. While the resin is being injected, the circuit pattern of a second layer of flexible circuit $26_b$ is traced on the table 12.

Figure 6:
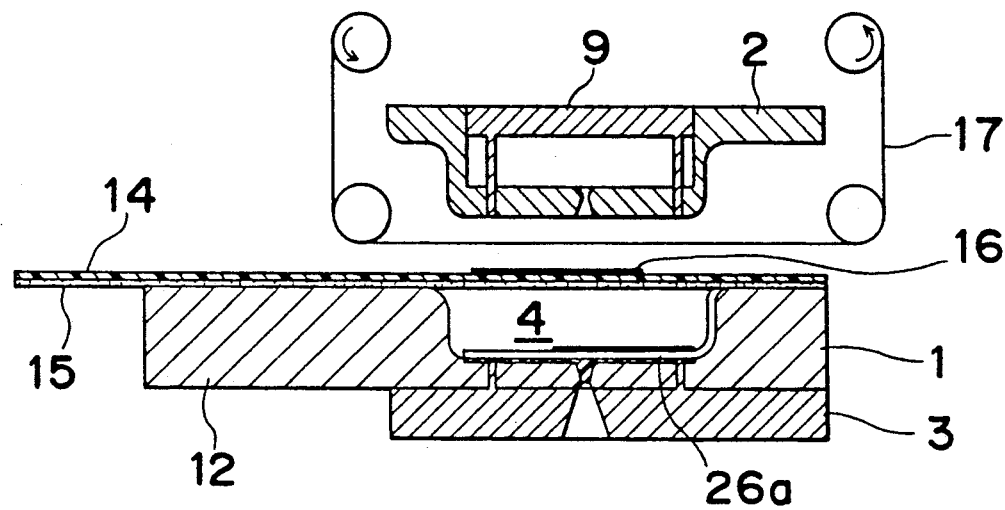
Figure 7:
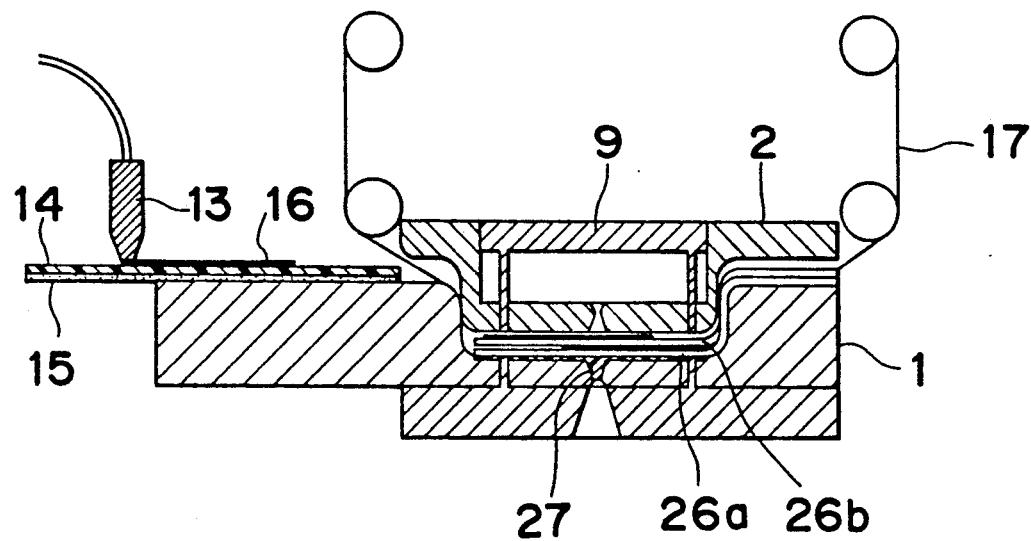
Figure 8:
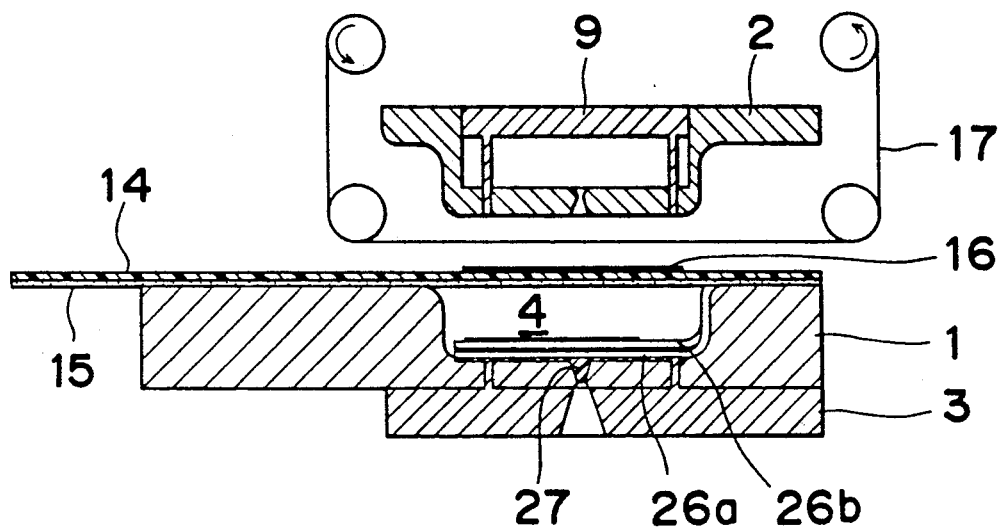
Figure 9:
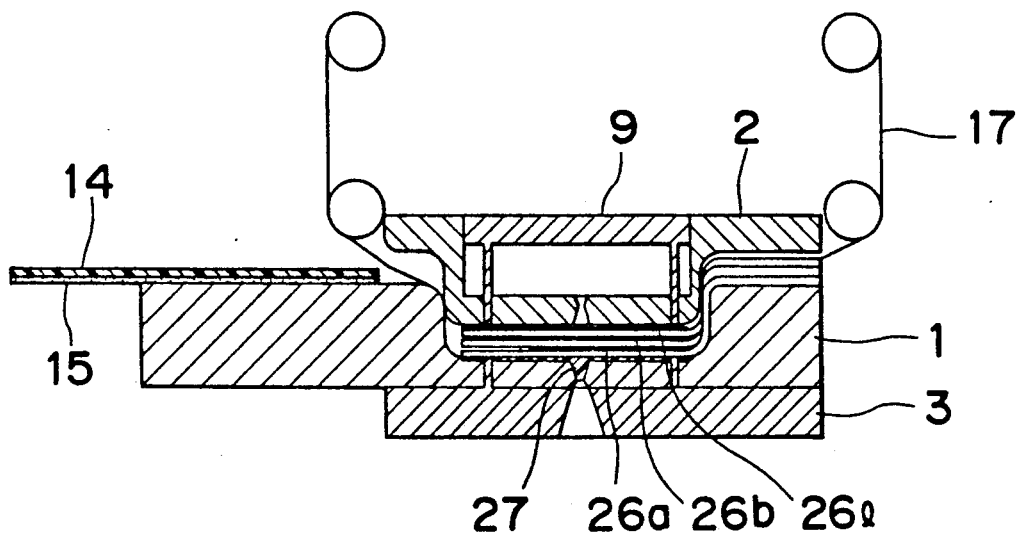

Then, the second layer of flexible circuit $26_b$ is pressed into the cavity 4 as shown in FIGS. 6 and 7. Similarly to the pressing of the first layer of flexible circuit $26_a$ into the cavity 4, the molding lubricant film 17 is sandwiched between the upper mold 2 and the second layer of flexible circuit $26_b$, the film 14 is cut, the conductive paste 16 is hardened and the adhesive layer 15 is softened by the heated upper mold 2, the pattern of the subsequent flexible circuit layer is traced, and the first flexible circuit layer and the second flexible circuit layer are adhered to each other by the cooled upper and lower molds 1 and 2. Thus, the second flexible circuit through the last layer of flexible circuit $26_l$ are sequentially pressed into the cavity 4 as shown in FIGS. 8 and 9. The adhesive layer 15 which has been softened by the heat of the upper mold 2 contacts the cooled flexible circuit 26. As a result, the temperature of the adhesive layer 15 falls, thus displaying a favorable adhesive strength.

Figure 10:
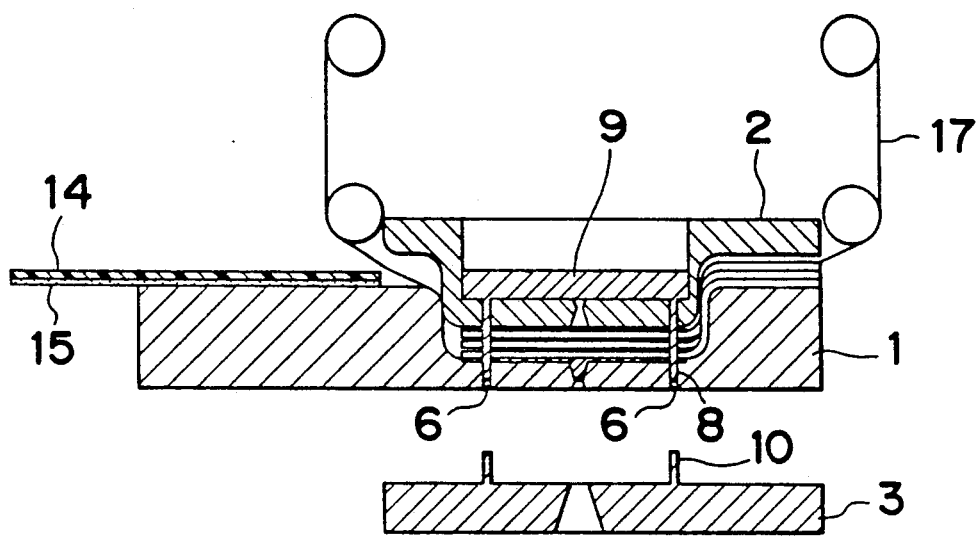
Figure 11:
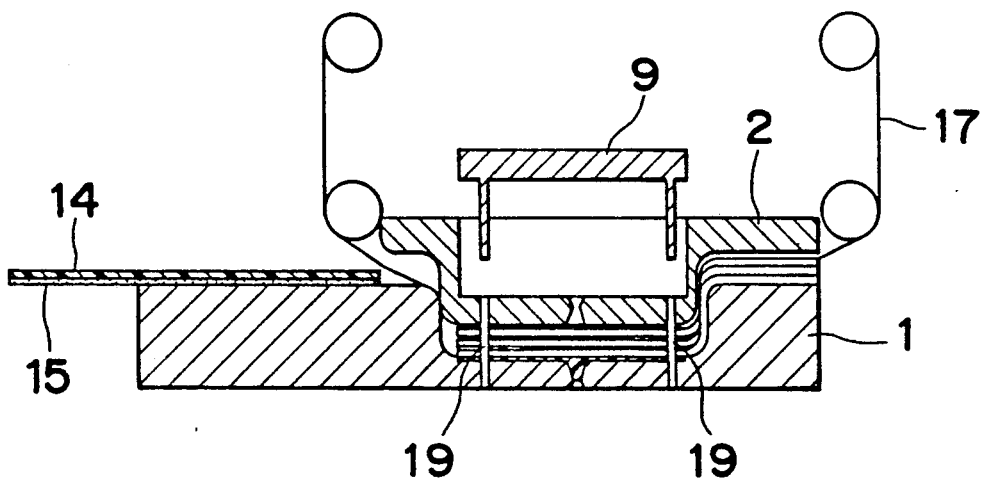

After the last layer of flexible circuit $26_l$ is pressed into the cavity 4, the through-holes 19 are formed as shown in FIGS. 10 and 11. In the through-hole forming process, the lower member 3 is separated from the lower mold 1 and the small holes 6 are opened with the upper mold 2 inserted in the cavity 4 of the lower mold 1. Thereafter, with the downward movement of the punching die 9, the pin 8 punches the through-holes 19 through a multi-layer flexible circuit $26_m$ and the resin 27 at predetermined positions thereof. Waste formed by punching is discharged from the small holes 6 to the outside of the lower mold 1. With the formation of the through-holes 19, the punching die 9 is removed from the upper mold 2 with the upper mold 2 remaining in the cavity 4.

Figure 12:
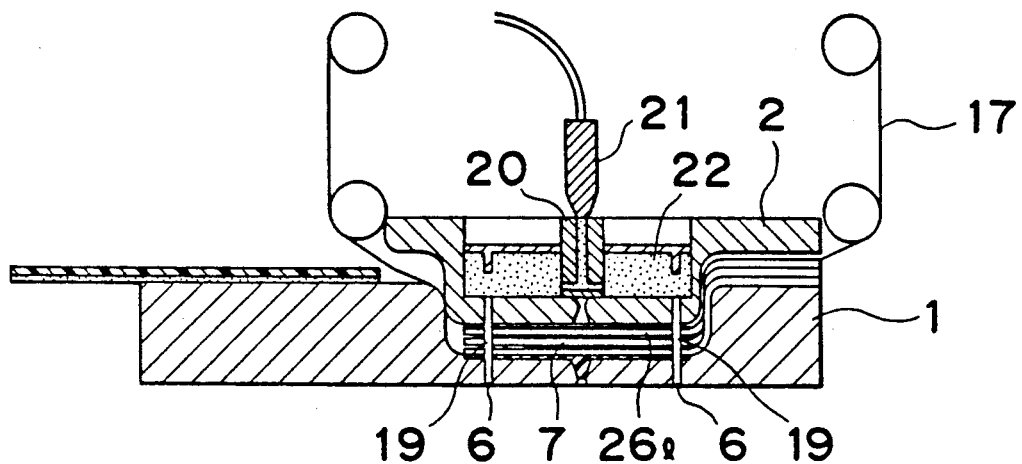
Figure 13:
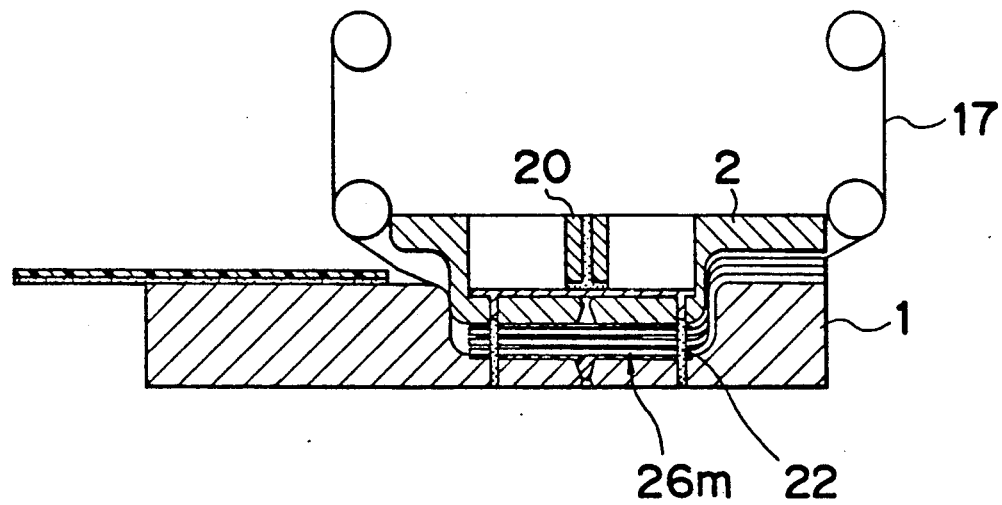

After the punching die 9 is removed from the upper mold 2, a jig 20 as shown in FIG. 12 is mounted in the recess of the upper mold 2. A conductive paste 22 injected from a nozzle 21 is stored between the jig 20 and the upper mold 2 and then, pressure is applied to the conductive paste 22 so as to press it into the through-holes 19 as shown in FIG. 13. The nozzle 13 may be used instead of the nozzle 21 if the conductive paste 22 is the same as the conductive paste 16 for forming the pattern of each flexible circuit. The jig 20 is mounted in the recess of the upper mold 2 with the gate 7 covered with the jig 20 so that the stored conductive paste 22 does not flow from the gate 7 into the cavity 4. At this time, the molding lubricant film 17 serves as a packing between the upper mold 2 and the last flexible circuit $26_l$.

Figure 14:
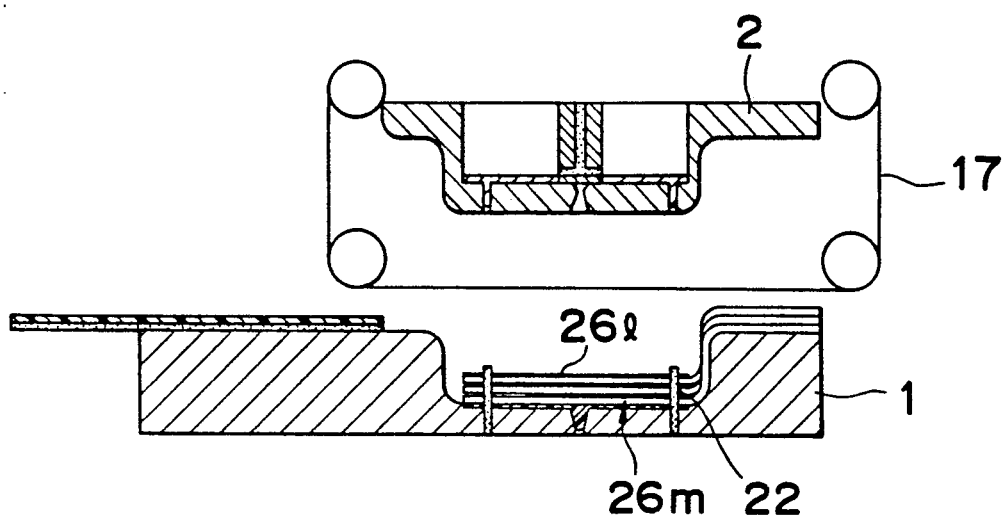
Figure 15:
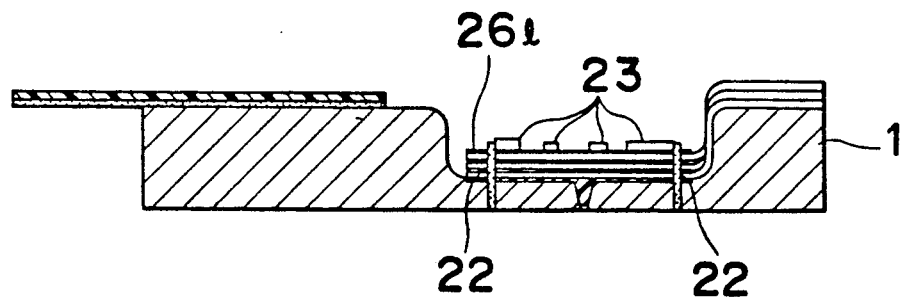
Figure 16:
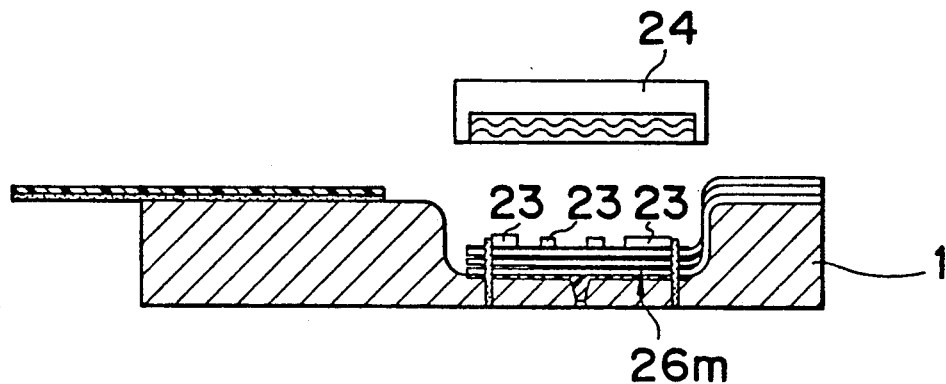

After the conductive paste 22 is charged into the through-holes 19, the upper mold 2 is removed from the cavity 4 by moving the upper mold 2 and the jig 20 upward as shown in FIG. 14. At this time, the molding lubricant film 17 is also removed from the cavity 4. As shown in FIG. 15, desired electrical parts such as a capacitor or a transistor are mounted on the multi-layer flexible circuit $26_m$ which has remained in the cavity 4 as necessary. The upper mold 2 is heated at a low temperature so that the pattern of the last layer of flexible circuit $26_l$ is not completely hardened before the electric parts are mounted on the multi-layer flexible circuit $26_m$. After the electric parts are mounted on the multi-layer flexible circuit $26_m$, the upper surface of the multi-layer flexible circuit $26_m$ is heated by an infrared heater 24 placed above the cavity 4 so as to completely harden the conductive paste positioned between the last layer of flexible circuit $26_l$ and the electric parts 23 as well as the conductive paste 22 in the through-hole 19 as shown in FIG. 16. The upper surface of the flexible circuit $26_m$ may be dried by hot blast or the heater 30 provided in the upper mold 2 instead of the infrared heater 24. Thus, an electric construction comprising the multi-layer flexible circuit $26_m$ and the electrical parts 23 is completed.

Figure 17:
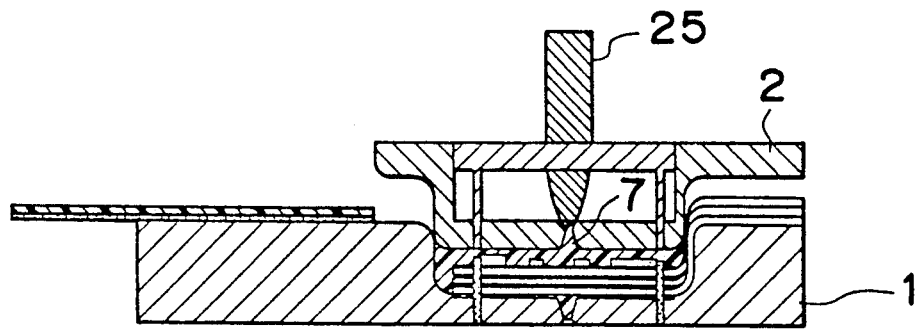
Figure 18:
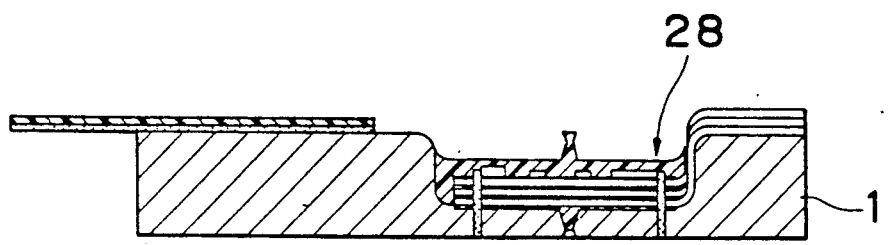
Figure 19:
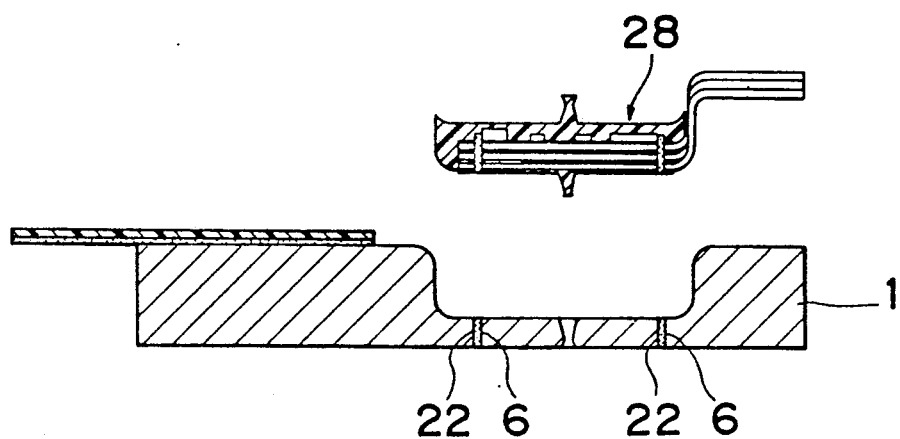
Figure 20:
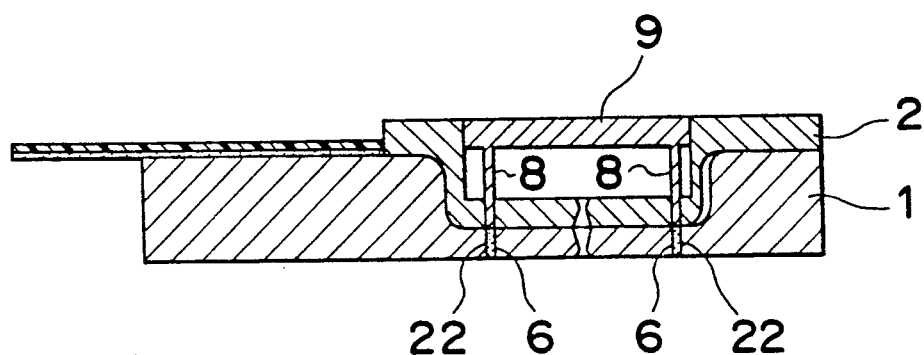
Figure 21:
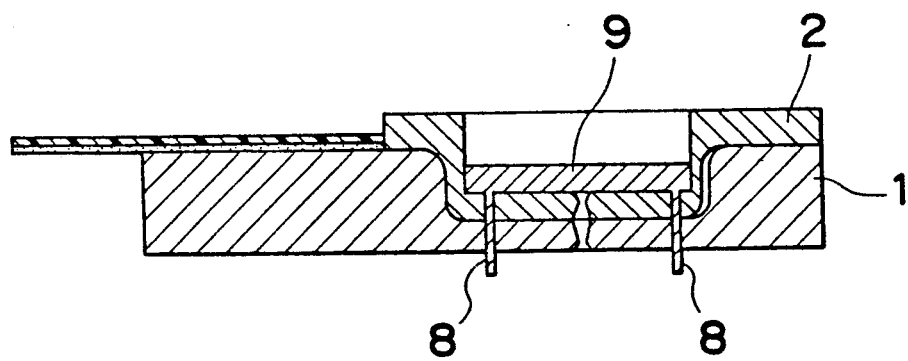

The upper mold 2 is moved downward into the cavity 4 again as the final process of forming the multi-layer flexible circuit. Thereafter, a resin injecting nozzle 25 injects a resin from the gate 7 as shown in FIG. 17. When the resin is hardened to some extent by cooling, the upper mold 2 is removed from the cavity 4 as shown in FIG. 18 and then, a product 28 is taken out from the cavity 4. Thus, the molding process is completed. Finally, the upper mold 2 is inserted into the cavity 4 together with the punching die 9. When the punching die 9 is pressed downward, the conductive paste 22 which has remained in the small holes 6 of the lower mold 1 are cleaned as shown in FIGS. 20 and 21.

According to the above-described method and the apparatus, a product in which the multi-layer flexible circuit is embedded can be manufactured. In addition, the process for layering flexible circuits on each other, forming the through-holes by post-process, and charging conductive paste into the through-hole can be carried out by the mold and devices provided in the vicinity thereof.

In addition to the molding method by injecting a resin, compression molding, transfer molding, blow molding or casting may be used. Instead of resin, ceramic or a conductive metal may be used as a material to be molded if the metal can be insulated from the pattern of a multi-layer flexible circuit.

According to the above-described embodiment, the fixed lower mold is integrated with the table, but it is possible to construct the apparatus so that all processes including the formation of a circuit pattern are carried out above the cavity of the fixed lower mold. To this end, the movable upper mold which is positioned above the fixed lower mold, the table, the resin injecting nozzle, and other mechanisms are constructed to be movable vertically and horizontally.

The pattern of each flexible circuit is traced in the above-described embodiment, but a flexible printed circuit may be utilized by sequentially feeding a film having the pattern of each flexible circuit arranged thereon between the upper and lower molds.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A method for molding an article integrated with a multi-layer flexible circuit comprising following steps of:
    (a) forming a flexible circuit by tracing a circuit pattern with a thermosetting conductive paste on a surface of a film base having an adhesive layer of hot-melt type on a rear surface thereof;
    (b) setting said flexible circuit between a fixed mold having a closed small hole which can be opened to form a through-hole and a movable mold cooperating with said fixed mold and having a punching die cooperating with said small hole of said fixed mold so that said punching die can be inserted into said movable mold and is movable relative thereto;
    (c) sandwiching said flexible circuit between said movable mold heated and said fixed mold so as to make a layer of said flexible circuit on said fixed mold;
    (d) charging a predetermined amount of molding material between said fixed mold and said layer of flexible circuit;
    (e) reducing the temperature of said layer of flexible circuit sandwiched at the step (c) and said molding material charged at the step (d);
    (f) repeating the steps (a), (b) and (c) at least once so that a plurality of said layers of flexible circuit is laminated on said molding material charged at the step (d);
    (g) forming a through-hole through said layers of flexible circuit laminated and said molding material by opening said small hole of said fixed mold and projecting said punching die of said movable mold therefrom;
    (h) charging thermosetting conductive paste into said through-hole;
    (i) heating said thermosetting conductive paste charged into said through-hole, so that a multi-layer flexible circuit is formed;
    (j) charging a predetermined amount of molding material between said multi-layer flexible circuit and said movable mold; and
    (k) reducing the temperature of said molding material charged at the step (j).

2. A method for molding an article integrated with a multi-layer of flexible circuit comprising following steps of:
    (a) forming a flexible circuit by tracing a circuit pattern with a thermosetting conductive paste on a surface of a film base having an adhesive layer of hot-melt type on a rear surface thereof;
    (b) setting said flexible circuit between a fixed mold having a closed small hole which can be opened to form a through-hole and a movable mold cooperating with said fixed mold and having a punching die cooperating with said small hole of said fixed mold so that said punching die can be inserted into said movable mold and is movable relative thereto;
    (c) sandwiching said flexible circuit between said movable mold heated and said fixed mold so as to make a layer of said flexible circuit on said fixed mold;
    (d) charging a predetermined amount of molding material between said fixed mold and said layer of flexible circuit;
    (e) reducing the temperature of said layer of flexible circuit sandwiched at the step (c) and said molding material charged at the step (d);
    (l) repeating the steps (a), (b) and (c) at least once so that a plurality of said layers of flexible circuit is laminated on said molding material charged, wherein a temperature of said movable mold heated at the last step (c) is lower than that at the other step (c);
    (g) forming a through-hole through said layers of flexible circuit laminated and said molding material by opening said small hole of said fixed mold and projecting said punching die of said movable mold therefrom;
    (h) charging thermosetting conductive paste into said through-hole;

(m) mounting a predetermined electric parts on the circuit pattern of said layer of flexible circuit sandwiched at said last step (c);

(n) heating the conductive paste charged into said through-hole and conductive paste for forming the pattern of said layer of flexible circuit on which said predetermined electric parts has been mounted at the step (m);

(j) charging a predetermined amount of molding material between said layer of flexible circuit sandwiched at said last step (c) and said movable mold; and (k) reducing the temperature of said molding material charged at step (j).

3. A method for molding an article integrated with a multi-layer flexible circuit as claimed in claim 2, wherein the heating at the step (n) is carried out by a heater provided in said movable mold.

4. An apparatus for molding an article integrated with a multi-layer flexible circuit comprising:

film supply means for feeding a film base having an adhesive layer of hot-melt type on a rear surface thereof;

supporting mean for supporting said film base;

tracing means for tracing a circuit pattern on said film base placed on said supporting means with thermosetting conductive paste;

a fixed mold having a first gate and a first small hole for forming a through-hole;

a movable mold, cooperating with said fixed mold, having a second gate, containing a heater, and having a second small hole which makes a pair with said first small hole and into which a movable punching die for forming said through-hole is slidably and removably inserted;

a movable pin positioned opposite to said movable mold with respect to said fixed mold for selectively opening and closing said first small hole.;

a first nozzle for injecting a molding material from said first gate of said fixed mold;

a second nozzle for injecting a molding material from said second gate of said movable mold;

guiding means for charging thermosetting conductive paste from said second small hole into said throughhole by closing said second gate of said movable mold;

a third nozzle supplying said thermosetting conductive paste to said guiding means;

heat generation means for heating various materials on said fixed mold; and a molding lubricant film arranged along a forming surface of said movable mold.

5. An apparatus for molding an article integrated with a multi-layer flexible circuit as claimed in claim 4, wherein said fixed mold has a cavity and said supporting means is integrated with said fixed mold and shares an upper surface thereof with said fixed mold.

6. An apparatus for molding an article integrated with a multi-layer flexible circuit as claimed in claim 4, wherein said heat generation means is a heater contained in said movable mold.

7. An apparatus for molding an article integrated with a multi-layer flexible circuit as claimed in claim 4, further comprising cooling means for cooling various materials on said fixed mold.

* * * * *

UNITED STATES PATENT AND TRADEMARK OFFICE
CERTIFICATE OF CORRECTION

PATENT NO. : 5,118,458

DATED : June 2, 1992

INVENTOR(S) : Munekazu NISHIHARA et al.

It is certified that error appears in the above-identified patent and that said Letters Patent is hereby corrected as shown below:

On the title page:
In the heading: after line [22] and before line [51], read:

[30] Foreign Application Priority Data: July 17, 1990 [JP] Japan 2-188911

Signed and Sealed this

Tenth Day of August, 1993

Attest:

MICHAEL K. KIRK

*Attesting Officer*     Acting Commissioner of Patents and Trademarks